(12) United States Patent
Ravi et al.

(10) Patent No.: US 7,146,140 B2
(45) Date of Patent: Dec. 5, 2006

(54) QUADRATURE OSCILLATOR AND METHODS THEREOF

(75) Inventors: Ashoke Ravi, Hillsboro, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 431 days.

(21) Appl. No.: 10/608,128

(22) Filed: Jun. 30, 2003

(65) Prior Publication Data

US 2004/0266380 A1    Dec. 30, 2004

(51) Int. Cl.
 *H03J 7/32* (2006.01)
(52) U.S. Cl. .................. 455/146; 455/147; 331/135; 331/136
(58) Field of Classification Search ................ 455/146, 455/147, 258, 259, 264, 265, 315, 318, 319; 331/56, 108 B, 135, 136, 137, 140, 167
See application file for complete search history.

(56) References Cited

U.S. PATENT DOCUMENTS

| | | | |
|---|---|---|---|
| 3,832,713 A | 8/1974 | Rubin | |
| 4,198,604 A | 4/1980 | Holdaway | |
| 5,489,878 A * | 2/1996 | Gilbert | 331/57 |
| 5,717,730 A | 2/1998 | Prakash et al. | |
| 5,739,711 A * | 4/1998 | Mandelcorn | 327/175 |
| 5,940,143 A | 8/1999 | Igarashi et al. | |
| 6,124,763 A * | 9/2000 | Lemaire | 331/45 |
| 6,175,285 B1 | 1/2001 | Gabara | |
| 6,239,661 B1 * | 5/2001 | Ali | 331/57 |
| 6,239,755 B1 | 5/2001 | Klemens et al. | |
| 6,404,288 B1 | 6/2002 | Bletz et al. | |
| 6,462,626 B1 | 10/2002 | Gharpurey | |
| 6,538,516 B1 | 3/2003 | Lenk | |
| 6,639,481 B1 * | 10/2003 | Ravi et al. | 331/177 V |
| 6,750,727 B1 * | 6/2004 | Sutardja | 331/117 R |
| 2002/0063607 A1 * | 5/2002 | Van Der Tang et al. | 331/100 |
| 2004/0266356 A1 * | 12/2004 | Javor et al. | 455/67.11 |

OTHER PUBLICATIONS

U.S. Appl. No. 10/608,549, filed Jun. 30, 2003, Ravi et al.
U.S. Appl. No. 10/608,142, filed Jun. 30, 2003, Ravi et al.
U.S. Appl. No. 10/608,554, filed Jun. 30, 2003, Ravi et al.
U.S. Appl. No. 10/401,024, filed Mar. 28, 2003, Ravi et al.
A. Ravi et al., "An Integrated 10/5Ghz Injection-locked Quadrature LC VCO in a 0.18 μm digital CMOS process", European Solid State Research Conference (ESSCIRC), Sep. 26, 2002, pp. 1-4.

* cited by examiner

*Primary Examiner*—Quochien B. Vuong
*Assistant Examiner*—Christian A. Hannon
(74) *Attorney, Agent, or Firm*—Pearl Cohen Zedek Latzer LLP

(57) ABSTRACT

Briefly, exemplary embodiments of the invention may provide devices and methods to provide precise and/or low phase-noise quadrature oscillation signals. A quadrature oscillator in accordance with an exemplary embodiment of the invention may include, for example, a phase-shift generator to provide a phase-shift of substantially π/2 radians to an oscillation signal between a first oscillation tank, which provides substantially no phase-shift, and a second oscillation tank.

9 Claims, 4 Drawing Sheets

QUADRATURE OSCILLATOR AND METHODS THEREOF

BACKGROUND OF THE INVENTION

Radio Frequency (RF) transceivers may use quadrature modulation for higher spectral efficiency. The quality and accuracy of the quadrature signals that are used for modulation and demodulation directly affect the performance of the transceiver, and thus it is desirable that the quadrature signals be precise and have a low phase-noise. Consequently, these signals may be generated locally at the transceiver.

Generating precise, high-quality, low phase-noise quadrature signals with a phase-shift of $\pi/2$ may be very difficult. In some conventional oscillators, two resonant tanks are used, such that each tank operates in a non-linear region of its phase/frequency characteristic. This may result in degradation in the overall quality factor of each tank, reduction in output amplitude, and reduction in the phase-noise performance of the oscillator.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1:
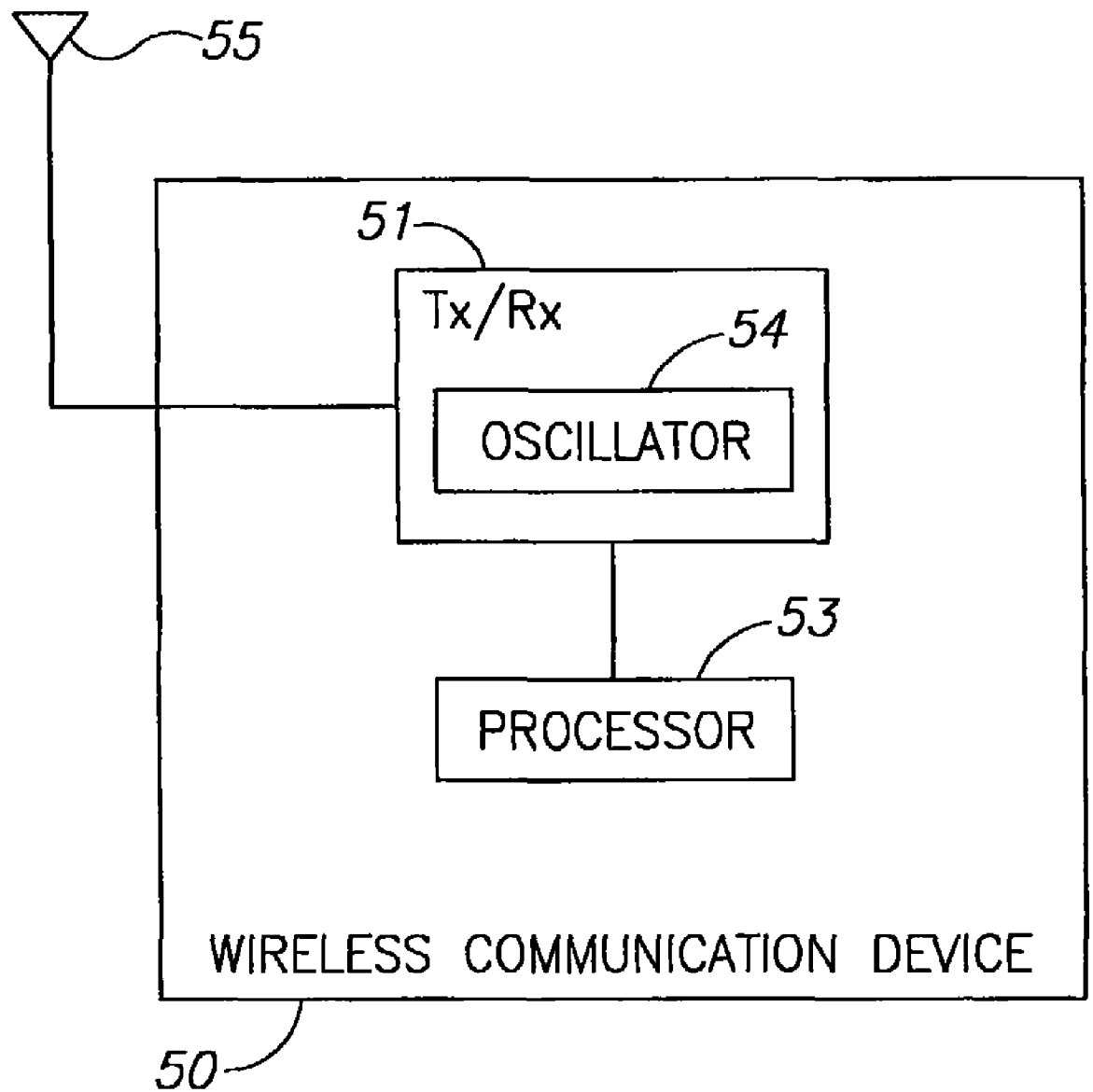
FIG. 1 is a schematic illustration of a wireless communication device incorporating a quadrature oscillator in accordance with some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, units and/or circuits have not been described in detail so as not to obscure the invention.

It should be understood that embodiments of the invention may be used in a variety of applications. Although the invention is not limited in this respect, embodiments of the invention may be used in many apparatuses, for example, a transmitter, a receiver, a transceiver, a transmitter-receiver, and/or a wireless communication device. Wireless communication devices intended to be included within the scope of the invention include, by way of example only, cellular radio-telephone communication systems, cellular telephones, wireless telephones, cordless telephones, Wireless Local Area Networks (WLAN) and/or devices operating in accordance with the existing 802.11a, 802.11b, 802.11g, 802.11n and/or future versions of the above standards, Personal Area Networks (PAN), Wireless PAN (WPAN), units and/or devices which are part of the above WLAN and/or PAN and/or WPAN networks, one way and/or two-way radio communication systems, one-way pagers, two-way pagers, Personal Communication Systems (PCS) devices, a Portable Digital Assistant (PDA) device which incorporates a wireless communication device, an ultra wide-band radio device, high-frequency clocks, high-frequency oscillators, high-frequency processors, and the like.

By way of example, types of cellular radio-telephone communication systems intended to be within the scope of the invention include, although not limited to, Direct Sequence—Code Division Multiple Access (DS-CDMA) cellular radio-telephone communication systems, Global System for Mobile Communications (GSM) cellular radio-telephone systems, North American Digital Cellular (NADC) cellular radio-telephone systems, Time Division Multiple Access (TDMA) systems, Extended-TDMA (E-TDMA) cellular radio-telephone systems, Wideband CDMA (WCDMA) systems, General Packet Radio Service (GPRS) systems, Enhanced Data for GSM Evolution (EDGE) systems, 3G systems, 3.5G systems, 4G systems, communication devices using various frequencies and/or range of frequencies for reception and/or transmission, communication devices using 2.4 Gigahertz frequency, communication devices using 5.2 Gigahertz frequency, communication devices using 24 Gigahertz frequency, communication devices using an Industrial Scientific Medical (ISM) band and/or several ISM bands, and other existing and/or future versions of the above.

It is noted that embodiments of the invention may be used in various other apparatuses It will be appreciated that the term "oscillator" as used herein may include, for example, an oscillator, an oscillator circuit, an oscillation circuit, an oscillation device, an oscillation unit, a device including an oscillation circuit, an oscillator tuning circuit, an oscillator tuning device, and/or any suitable circuit, circuitry, sub-circuit, device and/or unit (or any suitable combination thereof) which may produce, provide, create, change, modify, tune and/or fine-tune oscillation.

Some embodiments of the invention provide devices, circuits and methods using cross-coupled oscillators to provide precise and/or low phase-noise quadrature signals, which may be used, for example, in conjunction with high performance, low power, Radio Frequency (RF) transceivers that use a low cost, low voltage, digital, single-supply Complementary Metal-Oxide Semiconductor (CMOS) process.

FIG. 1 schematically illustrates a wireless communication device 50 incorporating a quadrature oscillator 54 in accordance with some embodiments of the invention. In exemplary embodiments of the invention, wireless communication device 50 may further include a transceiver 51, a processor 53, and an antenna 55.

Processor 53 may include, for example, a Central Processing Unit (CPU), a Digital Signal Processor (DSP), a chip, a microchip, or any other suitable multi-purpose or specific processor or micro-processor.

Antenna 55 may include an internal and/or external Radio Frequency (RF) antenna, for example, a dipole antenna or any other type of antenna suitable for sending and receiving signals to enable device 50 to communicate with a desired communication network.

Transceiver 51 may be implemented, for example, using one or more units performing separate or integrated functions, for example, in the form of separate transmitter and receiver units or in the form of a single transceiver unit or a single transmitter-receiver unit. Transceiver 51 may include quadrature oscillator 54, or several oscillators or oscillating circuits similar to quadrature oscillator 54.

Quadrature oscillator 54 may include an oscillator and/or an oscillating circuit in accordance with embodiments of the invention, for example, the oscillator circuits described in detail below with reference to FIGS. 2 and 3.

Figure 2:
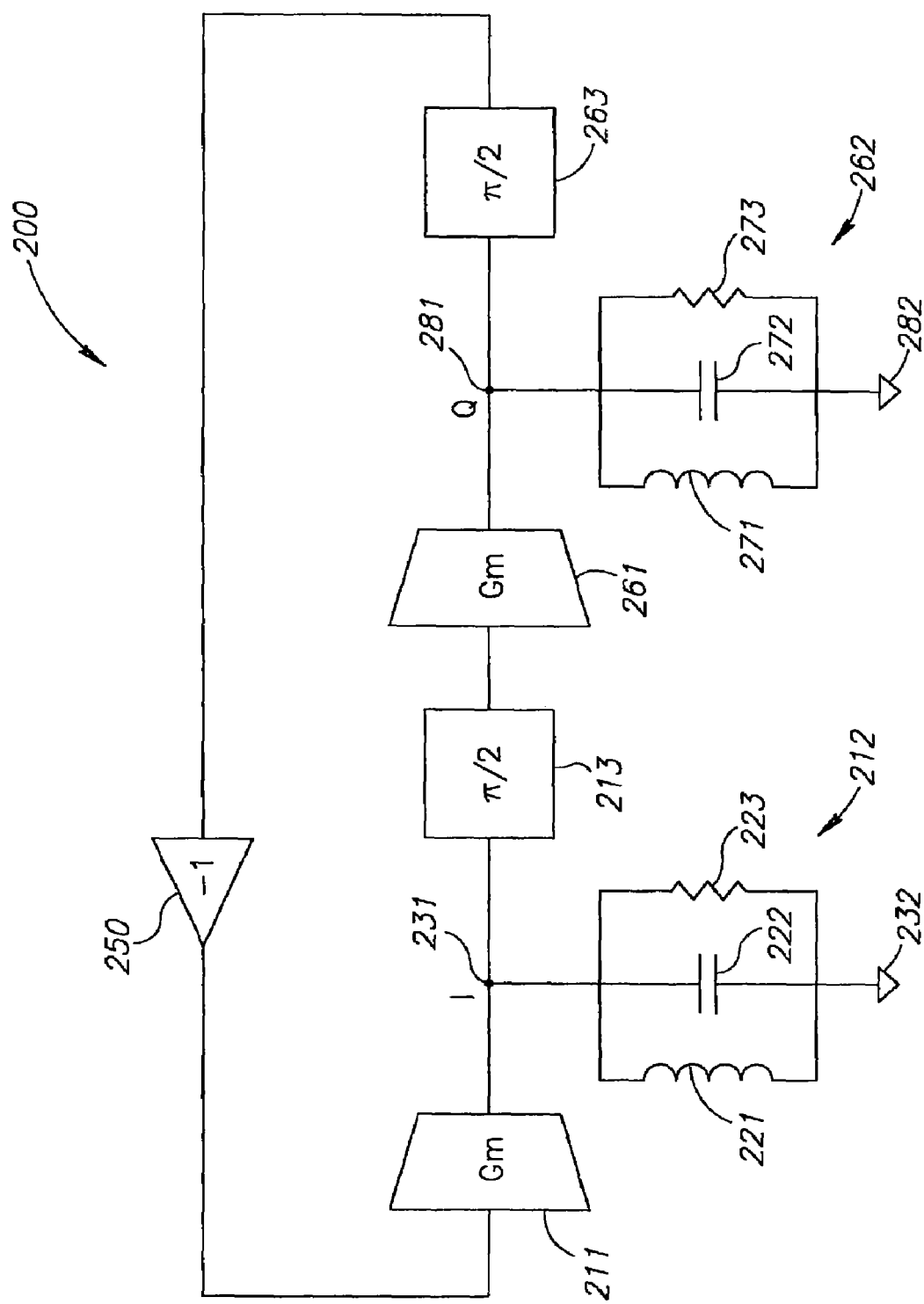
FIG. 2 is a schematic block illustration of a quadrature oscillator circuit in accordance with some embodiments of the invention.

FIG. 2 schematically illustrates a block diagram of a quadrature oscillator 200 in accordance with an exemplary embodiment of the invention. Quadrature oscillator 200 may include a transconductor 211, a Resistor Capacitor Inductor (RCL) oscillation tank 212, a phase-shift generator 213, a transconductor 261, a RCL oscillation tank 262, a phase-shift generator 263, and a phase-inverter 250. The components of quadrature oscillator 200 may be connected as illustrated schematically in FIG. 2, tank 212 may be connected between a node 231 and a sink 232, and tank 262 may be connected between a node 281 and a sink 282.

Tank 212 may include an inductor 221, a capacitor 222, and a resistor 223, which may be connected in parallel. Tank 262 may include an inductor 271, a capacitor 272, and a resistor 273, which may be connected in parallel. In an exemplary embodiment, to optimize efficiency, the free-running frequency of tank 212 may be similar or identical to the free-running frequency of tank 262; for example, tank 212 may be similar or identical to tank 262, such that properties of the components of tank 212 may be similar or identical to properties of the components of tank 262.

Phase-inverter 250 may include, for example, one or more amplifiers, transistors and/or sub-circuits able to invert a phase as is known in the art. For example, phase-inverter 250 may receive a signal at a phase of Phi radians and provide a signal at a phase of Phi−nπ radians or Phi+nπ, wherein n is an odd integer. In an exemplary embodiment, phase-inverter 250 may include an amplifier.

During operation of quadrature oscillator 200, transconductors 211 and 261 may convert voltage signals to current signals, which may be received by tanks 212 and 262, respectively. Tanks 212 and 262 may receive current signals and may oscillate at a frequency. The frequency may be determined by the properties of tanks 212 and 262, and/or by properties of other components within quadrature oscillator 200. In accordance with an exemplary embodiment of the invention, tank 212 may produce substantially no phase-shift.

Phase-shift generator 213 may provide a phase-shift of precisely or substantially π/2 radians. This may be achieved, for example, using a source-follower with a capacitive load. As a result of the operation of phase-shift generator 213, a phase-shift of π/2 radians may exist between an I signal produced by tanks 212 at node 231 and a Q signal produced by tank 262 at node 281. Hence, quadrature oscillation may exist at nodes 231 and 281.

Additionally, phase-shift generator 263 may provide a phase-shift of precisely or substantially π/2 radians, for example, using a source-follower with a capacitive load; and phase-inverter 250 may perform inversion and thus may provide an additional phase-shift of, for example, −π or π radians. As a result, the combined or accumulated phase-shift within quadrature oscillator 200 over one loop may be equal to zero radians.

In an exemplary embodiment, phase-inverter 250 may produce a gain such that the total loop gain within quadrature oscillator 200 is equal to one. In such case, quadrature oscillator 200 may satisfy Barkhausen criterion, since a total loop gain within quadrature oscillator 200 is equal to one, and a total loop phase-shift within quadrature oscillator 200 is equal to zero radians.

It is noted that in some embodiments of the invention, tanks 212 and 262 may not include resistive loads. This may mitigate or eliminate degradation of a quality factor of tanks 212 and 262 and quadrature oscillator 200.

It is noted that the quadrature signals provided by quadrature oscillator 200 may be used, for example, in a closed-loop circuit, a feedback loop circuit, a Phase-Locked Loop (PLL) circuit, or various other circuits and devices operating in conjunction with quadrature oscillation. In some embodiments, symmetrical tanks and/or components may be used.

Exemplary embodiments of the invention provide methods of quadrature oscillation, for example, including the following operations, some or all of which operations may be performed using the circuits described above or circuits with similar structure and/or functionality.

In accordance with an exemplary embodiment of the invention, a voltage signal having a phase of Phi radians and a frequency $f$ may oscillate in a closed-loop oscillator circuit. The frequency $f$ may be determined by properties of the components of first and second oscillation tanks and/or other components of the oscillator circuit. The voltage signal may be converted to a current signal using a first transconductor, for example, transconductor 211. The current signal may be received by a first oscillation tank, for example, tank 212. The first oscillation tank may oscillate at frequency $f$. In accordance with an exemplary embodiment of the invention, the first oscillation tank may produce substantially no phase-shift.

A first phase-shift generator, for example, phase-shift generator 213, may receive the voltage signal of the first oscillation tank at a phase of Phi radians. The first phase-shift generator may increase the phase by π/2 radians and may provide a voltage signal at a phase of Phi+π/2 radians. The voltage signal may be converted to a corresponding current signal. This may be performed using a second transconductor, for example, transconductor 261. The current signal may be received by a second oscillation tank, for example, tank 262. The second oscillation tank may oscillate at frequency $f$. In accordance with an exemplary embodiment of the invention, the second oscillation tank may produce substantially no phase-shift.

Optionally, for symmetry, a second phase-shift generator, for example, phase-shift generator 263, may receive the voltage signal of the second oscillation tank at a phase of Phi+π/2 radians. The second phase-shift generator may increase the phase by π/2 radians to provide a voltage signal at a phase of Phi+π radians. The voltage signal from the second phase-shift generator may be transferred over a closed loop back to the first transconductor.

Before the voltage signal at a phase of Phi+π radians is received by the first transconductor, a phase-inversion may be performed, for example, using phase-inverter 250. It would be appreciated that the phase-inversion may satisfy at least a first of two conditions of Barkhausen criterion, namely, that a total phase-shift across one loop of the circuit may be equal to zero radians. Optionally, the phase-inversion may include signal amplification, as may be necessary to satisfy at least a second of two conditions of Barkhausen criterion, namely, that a total loop gain may be equal to one. It is noted that in an exemplary embodiment, both conditions of Barkhausen criterion may be satisfied, as described above.

In some embodiments, the above operations may be repeated, for example, continuously or substantially continuously. Additionally or alternatively, other operations and/or series of operations and/or methods may be used in accordance with embodiments of the invention.

Figure 3:
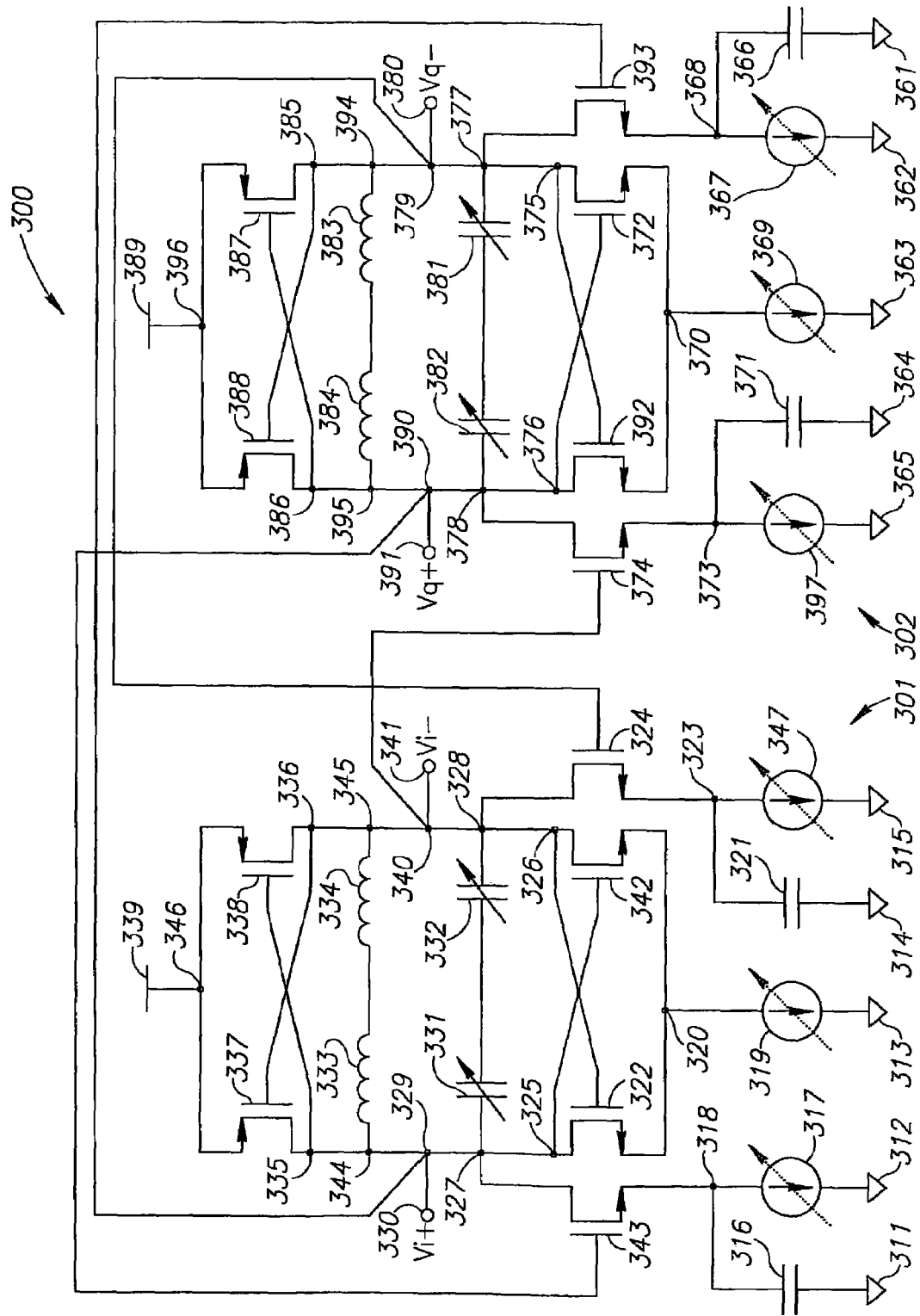
FIG. 3 is a schematic illustration of a cross-coupled quadrature oscillator circuit in accordance with some embodiments of the invention.

FIG. 3 schematically illustrates a circuit diagram of a quadrature oscillator circuit 300 in accordance with some embodiments of the invention. Quadrature oscillator circuit 300 may include a sub-circuit 301 and a sub-circuit 302, which may be cross-coupled as described in detailed below.

Within sub-circuit 301, a voltage supply 339 may be connected to a node 346. Node 346 may be connected to a source terminal of a transistor 337, and to a source terminal of a transistor 338. A drain terminal of transistor 337 may be connected to a node 335, and a drain terminal of transistor 338 may be connected to a node 336. A gate terminal of transistor 337 may be connected to node 336, and a gate terminal of transistor 338 may be connected to node 335. Nodes 335, 344, 329, 330, 327 and 325 may all be interconnected. Nodes 336, 345, 340, 341, 328 and 326 may all be interconnected. Node 344 may be connected to an inductor 333, which may be connected to an inductor 334, which may be connected to node 345. Node 330 may have a positive in-phase voltage, and node 341 may have a negative in-phase voltage.

Node 327 may be connected to a tunable capacitor 331, which may be connected to a tunable capacitor 332, which may be connected to node 328. Node 325 may be connected to a drain terminal of a transistor 322, and to a gate terminal of a transistor 342. Node 326 may be connected to a drain terminal of transistor 342, and to a gate terminal of transistor 322. A source terminal of transistor 322 may be connected to a node 320, and a source terminal of transistor 342 may be connected to node 320. Node 327 may be connected to a drain terminal of a transistor 343, and node 328 may be connected to a drain terminal of a transistor 324. A source terminal of transistor 343 may be connected to a node 318, and a source terminal of transistor 324 may be connected to a node 323.

Node 318 may be connected to a capacitor 316, which may be connected to a sink 311. Node 318 may provide a tunable current 317 to a sink 312. Node 323 may be connected to a capacitor 321, which may be connected to a sink 314. Node 323 may provide a tunable current 347 to a sink 315. Node 320 may provide a tunable current 319 to a sink 313.

Within sub-circuit 302, a voltage supply 389 may be connected to a node 396. Node 396 may be connected to a source terminal of a transistor 387, and to a source terminal of a transistor 388. A drain terminal of transistor 387 may be connected to a node 385, and a drain terminal of transistor 388 may be connected to a node 386. A gate terminal of transistor 387 may be connected to node 386, and a gate terminal of transistor 388 may be connected to node 385. Nodes 385, 394, 379, 380, 377 and 375 may all be interconnected. Nodes 386, 395, 390, 391, 378 and 376 may all be interconnected. Node 394 may be connected to an inductor 383, which may be connected to an inductor 384, which may be connected to node 395. Node 380 may have a positive in-phase voltage, and node 391 may have a negative in-phase voltage.

Node 377 may be connected to a tunable capacitor 381, which may be connected to a tunable capacitor 382, which may be connected to node 378. Node 375 may be connected to a drain terminal of a transistor 372, and to a gate terminal of a transistor 392. Node 376 may be connected to a drain terminal of transistor 392, and to a gate terminal of transistor 372. A source terminal of transistor 372 may be connected to a node 370, and a source terminal of transistor 392 may be connected to node 370. Node 377 may be connected to a drain terminal of a transistor 393, and node 378 may be connected to a drain terminal of a transistor 374. A source terminal of transistor 393 may be connected to a node 368, and a source terminal of transistor 374 may be connected to a node 373.

Node 368 may be connected to a capacitor 366, which may be connected to a sink 361. Node 368 may provide a tunable current 367 to a sink 362. Node 373 may be connected to a capacitor 371, which may be connected to a sink 364. Node 373 may provide a tunable current 397 to a sink 365. Node 370 may provide a tunable current 369 to a sink 363.

In an exemplary embodiment, sub-circuits 301 and 302 may be connected as follows: a gate terminal of transistor 343 may be connected to node 390, a gate terminal of transistor 393 may be connected to node 329, a gate terminal of transistor 324 may be connected to node 379, and a gate terminal of transistor 374 may be connected to node 340.

It will be appreciated by persons skilled in the art that the configuration described above of quadrature oscillator circuit 300 may be operated to provide precise quadrature signals or substantially precise quadrature signals.

Quadrature oscillator circuit 300 of FIG. 300 may be an exemplary implementation of quadrature oscillator 200 of FIG. 2, such that various groups of components in quadrature oscillator circuit 300 may perform operations and/or functions of a corresponding unit in quadrature oscillator 200. For example, a group including transistor 343, capacitor 316 and tunable current 317 of FIG. 3 may correspond to phase-shift generator 213 of FIG. 2; and a group including transistor 393, capacitor 366 and tunable current 367 of FIG. 3 may correspond to phase-shift generator 263 of FIG. 2.

Figure 4:
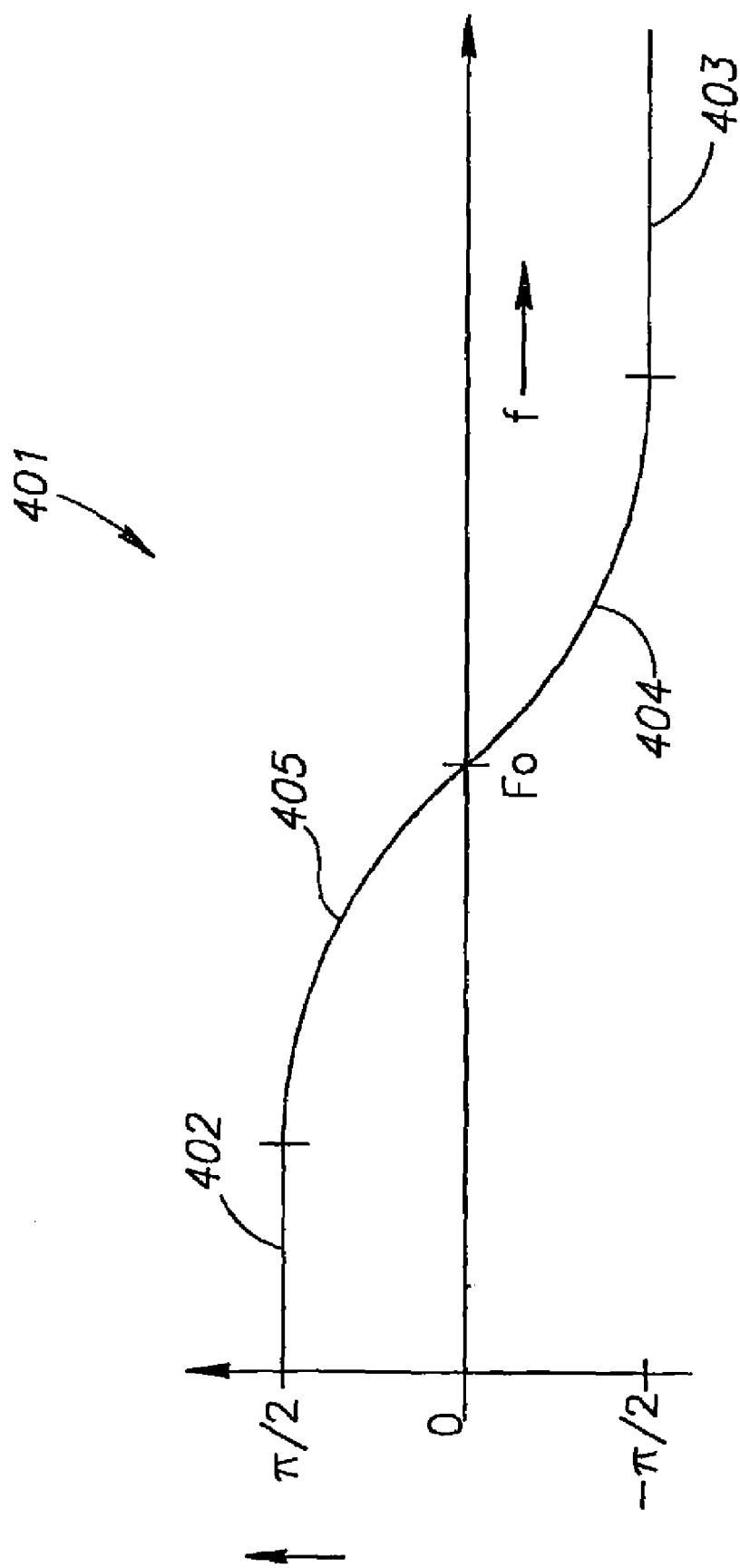
FIG. 4 is a schematic illustration of a phase-frequency graph useful in understanding some aspects of an exemplary embodiment of the invention.

FIG. 4 schematically illustrates a phase-frequency graph 401 useful in understanding some aspects of an exemplary embodiment of the invention. In some conventional oscillators, a resonant tank may operate in non-linear regions 403 or 404, which may result in degradation in the overall quality factor of the tank, reduction in output amplitude, and/or an increase in the phase-noise of an oscillator incorporating the tank.

In contrast, a resonant tank in accordance with an exemplary embodiment of the invention operates in linear regions 402 or 403. Therefore, it will be appreciated that a resonant tank in accordance with an exemplary embodiment of the invention avoids and/or mitigates degradation in the overall quality factor of the tank and/or reduction in output amplitude. Furthermore, it will be appreciated that oscillators incorporating a resonant tank in accordance with exemplary embodiments of the invention may have decreased phase-noise.

It is noted that in some circuit implementations of an oscillator in accordance with an exemplary embodiment of the invention, a non-significant deviation from $\pi/2$ phase-shifts may occur, for example, as a result of use of non-ideal transistors in some specific implementations. However, the non-ideal tanks may still be in the linear regions 402 or 403 of the phase-frequency characteristic to compensate for such potential deviation, and thus the effective quality factor of the tanks may not degrade significantly. Additionally or alternatively, in some embodiments of the invention, potential deviations may be mitigated and/or eliminated, for example, using suitable varactors and/or through a tail current source.

Some embodiments of the invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors, or devices as are known in the art. Some embodiments of the invention may include buffers, registers, storage units and/or memory units, for temporary or long-term storage of data or in order to facilitate the operation of a specific embodiment.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
   a first phase-shift generator to provide a phase-shift of substantially $\pi/2$ radians to an oscillation signal between a first oscillation tank, which provides substantially no phase-shift, and a second oscillation tank;
   a second phase-shift generator to provide a phase-shift of substantially $\pi/2$ radians to the oscillation signal from the second oscillation tank; and
   a phase-inverter to invert the phase of the oscillation signal,
   wherein the phase-inverter comprises an amplifier to provide a gain such that a total gain across a loop, which comprises the amplifier, the first and second oscillation tanks, and the first and second phase-shift generators, is equal to substantially one.

2. The apparatus of claim 1, comprising one or more transconductors to convert said oscillation signal from voltage to current.

3. An oscillator comprising:
   a first oscillation tank which produces substantially no phase-shift;
   a second oscillation tank which produces substantially no phase-shift;
   a first phase-shift generator to shift by substantially $\pi/2$ radians a phase of a signal from said first oscillation tank;
   a second phase-shift generator to shift by substantially $\pi/2$ radians a phase of a signal from said second oscillation tank; and
   a phase-inverter to invert a phase of a signal from said additional phase-shift generator,
   wherein the phase-inverter comprises an amplifier to provide a gain such that a total gain across a loop, which comprises the amplifier, the first and second oscillation tanks, and the first and second phase-shift generators, is equal to substantially one.

4. The oscillator of claim 3, comprising one or more transconductors to convert an oscillation signal of said loop from voltage to current.

5. A wireless communication device comprising:
   a dipole antenna to send and receive wireless signals; and
   a quadrature oscillator comprising a phase-shift generator to provide a phase-shift of substantially $\pi/2$ radians to an oscillation signal between a first oscillation tank, which provides substantially no phase-shift, and a second oscillation tank;
   a second phase-shift generator to shift by substantially $\pi/2$ radians a phase of a signal from said second oscillation tank; and
   a phase-inverter to invert a phase of a signal from said additional phase-shift generator,
   wherein the phase-inverter comprises an amplifier to provide a gain such that a total gain across a loop, which comprises the amplifier, the first and second oscillation tanks, and the first and second phase-shift generators, is equal to substantially one.

6. The wireless communication device of claim 5, comprising one or more transconductors to convert said oscillation signal from voltage to current.

7. A method comprising:
   generating a first phase-shift of substantially $\pi/2$ radians to an oscillation signal between a first oscillation tank, which provides substantially no phase-shift, and a second oscillation tank;
   generating a second phase-shift of substantially $\pi/2$ radians to the oscillation signal from the second oscillation tank; and
   inverting the phase of the oscillation signal,
   wherein inverting the phase comprises providing a gain such that a total gain across a loop, which comprises the first and second oscillation tanks, generating the first phase-shift, and generating the second phase-shift, is equal to substantially one.

8. The method of claim 7, wherein the second oscillation tank produces substantially no phase-shift.

9. The method of claim 7, comprising converting said oscillation signal from voltage to current.

* * * * *